United States Patent [19]

Frei et al.

[11] Patent Number: 5,223,691
[45] Date of Patent: Jun. 29, 1993

[54] PLASMA BASED SOLDERING METHOD REQUIRING NO ADDITIONAL HEAT SOURCES OR FLUX

[75] Inventors: John K. Frei, Mesa; Russell T. Fiorenzo, Scottsdale, both of Ariz.

[73] Assignee: Motorola, Inc., Schaumburg, Ill.

[21] Appl. No.: 709,673

[22] Filed: Jun. 3, 1991

[51] Int. Cl.⁵ .............................................. B23K 9/00
[52] U.S. Cl. ........................ 219/121.46; 219/85.22; 228/180.1
[58] Field of Search ............... 219/121.46, 121.43, 219/121.59, 85.1, 85.22; 228/180.1, 180.2

[56] References Cited

U.S. PATENT DOCUMENTS

| | | | |
|---|---|---|---|
| 4,921,157 | 5/1990 | Dishon et al. | 228/124 |
| 5,000,819 | 3/1991 | Pedder et al. | 156/643 |
| 5,128,506 | 7/1992 | Dahne et al. | 219/85.13 |
| 5,139,193 | 8/1992 | Todd | 228/180.2 |

FOREIGN PATENT DOCUMENTS

| | | |
|---|---|---|
| 427020 | 10/1990 | European Pat. Off. . |
| 63-293952 | 11/1988 | Japan . |
| 1-290294 | 11/1989 | Japan ............... 228/180.1 |
| 1177097 | 9/1985 | U.S.S.R. . |
| 2159753 | 12/1985 | United Kingdom . |

OTHER PUBLICATIONS

IBM Technical Disclosure, vol. 21, No. 7, "Chip-To-Pin Carrier Interconnection Systems", Ng, C.S.K., Dec. 1978.

Primary Examiner—Bruce A. Reynolds
Assistant Examiner—John A. Jeffery
Attorney, Agent, or Firm—Jeffrey D. Nehr

[57] ABSTRACT

A plasma based soldering method which uses a hydrogen-nitrogen gas mixture (5-15% hydrogen) to form a plasma, excited to simultaneously clean and heat solder. Only a relatively low vacuum of about 125 pascal (1 torr) is required. No heat sources beside the plasma are used to reflow the solder and no flux is necessary. Sensitive components can be shielded from plasma ion bombardment and need not be able to withstand the melt temperature of the solder used. The method is suitable for lead-tin solder and can be used to solder polyetherimide baseplates to teflon-glass printed wiring boards at junctions of gold-plated posts and matching gold-plated hole linings.

40 Claims, 1 Drawing Sheet

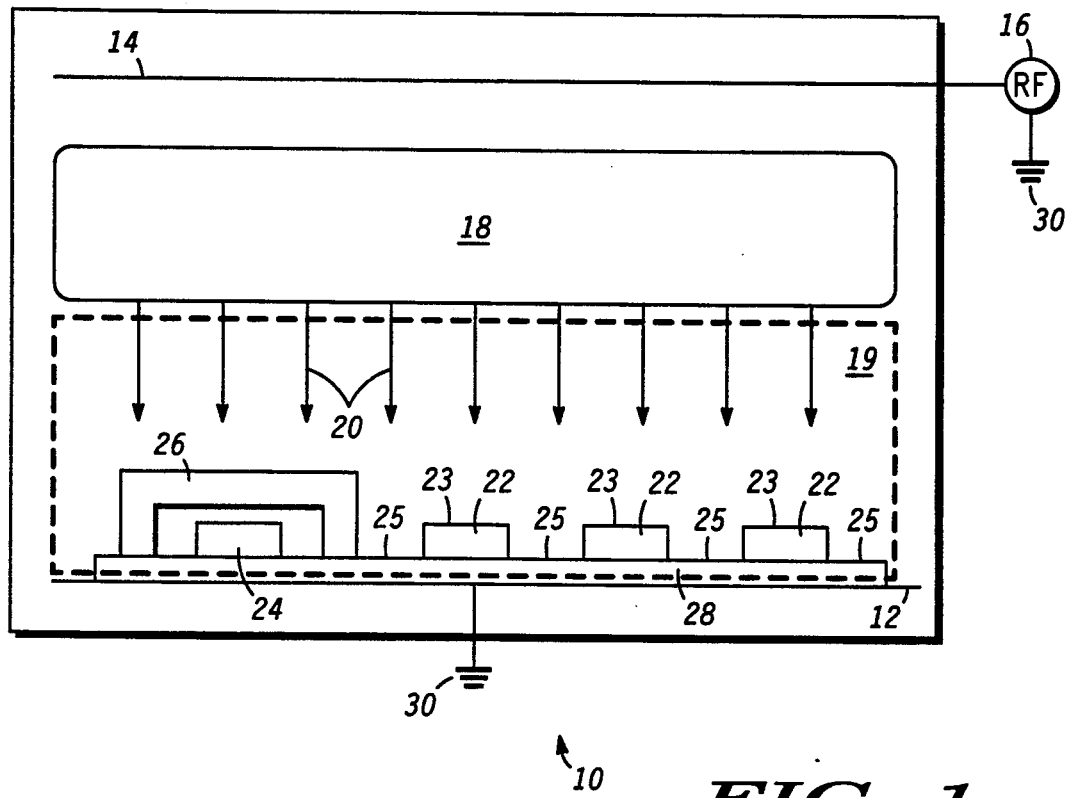
FIG. 1
FIG. 2
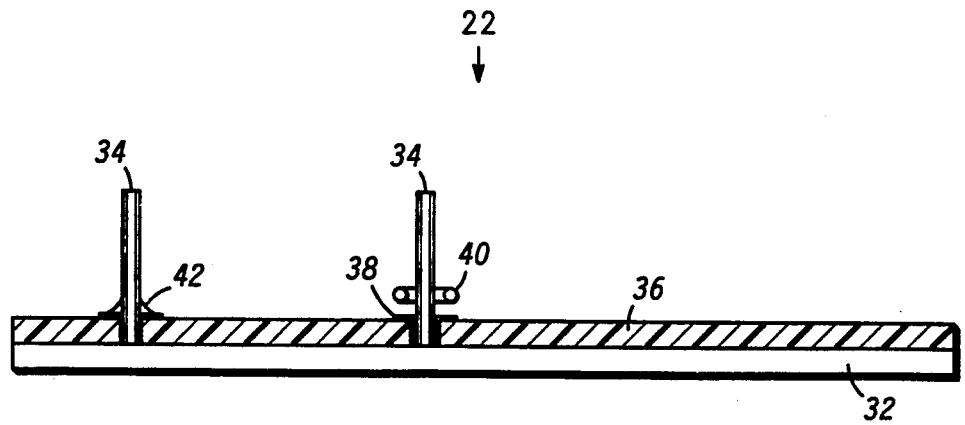

PLASMA BASED SOLDERING METHOD REQUIRING NO ADDITIONAL HEAT SOURCES OR FLUX

BACKGROUND OF THE INVENTION

This invention relates in general to the field of soldering and in particular to soldering using plasmas.

Soldering involves the physical and electrical connection of components or devices using an alloy with a low melting point. An example is a lead-tin alloy with a melting point of approximately 178 degrees Celsius (C).

Most soldering processes involve the basic steps of cleaning and deoxidizing, solder reflowing, and residue cleaning. Cleaning and deoxidizing are usually accomplished by applying a flux material to remove contaminants and oxides from the surfaces to be soldered. Oxides, typically with a higher melting point than solder, can form a barrier and prevent wetting of the surfaces to be soldered if they are not removed prior to the solder reflowing. Solder reflowing joins the surfaces to be soldered when the solder is reheated beyond its melting point. Residue cleaning involves the removal of flux residue from the cleaning and deoxidizing step. Residue cleaning becomes more difficult as the physical size of components to be soldered decreases, because it is more difficult for the residue cleaning agents to penetrate small gaps between the components and the substrate.

Both wave soldering and vapor phase soldering can used to heat the solder (and the substrate on which the component(s) are to be mounted) to the melting temperature (liquidus temperature) of the solder. Both methods subject all components and the substrate to the solder melting temperature and require the use of flux. Thus, all components must be capable of withstanding the soldering temperatures and cannot be affected by the cleaning solutions used to remove the residual flux.

Hand soldering involves soldering each solder joint by hand, one at a time. This method also requires flux and cleaning the flux after soldering. In hand soldering, components are subjected to local heating which may affect the material in the component or substrate, depending on the time and temperature required to make the solder joint. The substrate and component are each subjected to a high temperature in a localized area. Because of the thermal mass of the component or area being soldered, the material in the area being soldered generally must be heated 20-40 degrees Celsius above the solder melting temperature, increasing the potential for damage.

Several fluxless soldering processes have been developed to replace the pre-cleaning step and eliminate the need for flux residue cleaning. Among these fluxless processes are sputtering, fluorinated gas plasma use, and oxygen and pure nitrogen plasma use. Sputtering, which is limited in accuracy, penetrates only short distances, and can damage the substrates and components. Fluorinated gas plasma attack certain materials such as glass, and require scrubbed exhaust to meet environmental regulations. Oxygen plasmas, while usable with gold eutectic alloys of solder, will badly oxidize tin-lead solder. Pure nitrogen plasmas do not generally provide sufficient fluxing action to cause tin-lead solder to wet the substrate or components to be soldered. Also, reflow of the solder in the fluorinated gas, oxygen, and nitrogen plasma cases is typically accomplished by conventional application of heat from a heat source separate from the plasma itself.

SUMMARY OF THE INVENTION

Accordingly, it is an advantage of the present invention to provide a new and improved apparatus and method for plasma based soldering. It is a further advantage of the present invention to provide a method to reactively reduce oxides, not only on the solder itself, but also on the surfaces onto which the solder is to be flowed, to leave no contaminating compound on the surfaces to be absorbed into the solder during reflow. It is still a further advantage of the present invention to provide a method for providing a plasma to provide the heat necessary to take the solder above its melting point, without using other heat sources.

To achieve these advantages, a plasma based soldering method is contemplated which does not require the use of flux, and which does not require heat sources other than the excited plasma. The method comprises depositing solder at two immediately adjacent surfaces which are to be solder bonded together, and covering components and/or surfaces not to be soldered or heated with a shield. The surfaces to be soldered and shielded surfaces are placed in a chamber which is evacuated to a low pressure. A plasma is provided in the chamber and excited to cause cleaning of the surfaces and the solder; shielded surfaces and/or components are not directly heated or cleaned. The excited plasma causes heating in the solder, which reflows on the surfaces to form a high integrity solder bond.

The above and other features and advantages of the present invention will be better understood from the following detailed description taken in conjunction with the accompanying drawings.

BRIEF DESCRIPTION OF THE DRAWINGS

In FIG. 1, there is shown a schematic of a plasma based soldering apparatus in accordance with a preferred embodiment of the invention.

In FIG. 2, there is shown a schematic of an unshielded component undergoing plasma based soldering.

DETAILED DESCRIPTION OF THE PREFERRED EMBODIMENT

Plasma processing has been used extensively in the semiconductor industry for growth of thin film materials and dry etching. The plasma is able to generate chemically active species at low temperature since the plasma is in a non-equilibrium state. The temperature of the plasma (chemical species) is generally near ambient. The electron energy (not thermal energy) is quite high, however, and can break molecular bonds, creating ionic species. One feature of a plasma is that chemical reactions which occur only at high temperatures can be made to occur at lower temperatures in the presence of a plasma.

In FIG. 1, there is shown a schematic of a plasma based soldering apparatus within a plasma chamber 10. Either a barrel (tube) or planar reactor can be used, and the plasma 18 generated by several means. Examples include radio frequency (RF) or direct current (DC) generation. In accordance with a preferred embodiment of the invention, a barrel plasma RF version is described, with RF source 16 connected between first electrode 14 and electrical ground 30. Second electrode 12 is opposite first electrode 14 in plasma chamber 10 and the second electrode 12 is connected to electrical ground 30. RF source 16 can be a 500 Watt (W) peak RF power generator operating at 13.56 megaHertz (MHz). The RF source 16 can be located outside of plasma chamber 10, while the first electrode 14, second electrode 12, plasma 18, unshielded components 22, shielded component 24, shield 26, and substrate 28 are located inside the plasma chamber 10.

RF source 16 excites plasma 18, which is contained in the volume between the first electrode 12 and the second electrode 14. RF source 16 creates a changing electromagnetic field in the region between the first electrode 12 and the second electrode 14, which causes ionization of the plasma gases and an increase in kinetic energy in the plasma ions 20.

The interior of the plasma chamber 10 can be at a pressure of approximately 127 pascal (Pa), i.e. about 0.95 torr. A standard mechanical pump is capable of maintaining this vacuum, with no special pumps to achieve a higher vacuum, such as cryopumps or turbomolecular pumps required.

Plasma 18 can be made from forming gas, containing approximately 10% hydrogen and 90% nitrogen. The mixture should contain more than 5% hydrogen to enable tin-lead solder to wet the substrate 28 and/or unshielded components 22 to be soldered. While increased concentrations of hydrogen would also serve the desired function, the use of pure hydrogen gas creates a safety concern as pure hydrogen gas is explosive. Special equipment, such as alarms and burn-off apparatus, are required for using pure hydrogen gas. Mixtures of hydrogen and nitrogen are flammable at hydrogen concentrations above 15%. The use of forming gas with 10% hydrogen and 90% nitrogen requires no special safety precautions. Similarly, no fluorinated gas plasma is used. A plasma chamber 10 with a glass lining could be damaged with extensive use of a fluorinated gas plasma.

The RF source 16 excitation of the plasma 18 creates energetic plasma ions 20 in the zone of the plasma sheath 19. The plasma ions 20 impinge on unshielded components 22 and shielded component 24. Shield 26 covers shielded component 24 and prevents the plasma ions 20 from reaching shielded component 24. Shield 26 may be of any geometry to cover shielded component 24. Shield 26 can be composed of glass, aluminous ceramic, or any material known to act as an RF shield. Both shielded component 24 and unshielded components 22 are mounted on substrate 28. Substrate 28 is located adjacent to electrode 12, in the region between first electrode 10 and second electrode 12.

In operation, the plasma ions 20 are not reactive enough to perform etching except on some materials such as photoresist. The surfaces 23 and 25 of unshielded components 22 and substrate 28, respectively, exposed to the impinging plasma ions 20, absorb the impinging plasma ions 20, react with the impurities on surfaces 23 and 25, and desorb the products of the reactions. Surfaces 23 and 25, cleaned by impinging plasma ions 20, are thereby raised in surface energy, resulting in a reduced wetting angle for good continuous uniform flow of solder during solder reflowing.

The time for the soldering procedure can take on the order of one minute to evacuate the plasma chamber 10. Approximately seven or eight minutes can be required to energize the plasma ions 20 to the point where cleaning of surfaces 23 and 25 and solder reflow occur.

Shielded component 24 is protected from plasma ion 20 bombardment by the physical barrier of shield 26. In addition, the RF-shielding nature of shield 26 prevents plasma ion 20 excitation in the volume enclosed by the covering of shield 26, i.e., the space immediately surrounding shielded component 24.

In FIG. 2, there is shown unshielded component 22 undergoing plasma based soldering. Unshielded component 22 comprises gold-plated polyetherimide (PEI) baseplate 32 and teflon-glass printed wiring board (PWB) 36. Gold-plated PEI baseplate 32 comprises gold-plated posts 34 protruding from one surface. Teflon-glass PWB 36 contains holes through which the gold-plated posts 34 are inserted so that PEI baseplate 32 and teflon-glass PWB 36 are immediately adjacent to one another. A gold-plated pad 38 lines each hole in teflon-glass PWB 36 through which a gold-plated post 34 passes. Each gold-plated pad 38 has a collar slightly larger than the diameter of the hole in teflon-glass PWB 36 through which each gold-plated post 34 passes. Each gold-plated post 34 protrudes beyond the surface of teflon-glass PWB 36 opposite the surface of teflon-glass PWB 36 immediately adjacent to PEI baseplate 32. Each gold-plated post 34 can be used for later electrical connections.

Fluxless solder preform 40, which can be in the form of a solder preform in a doughnut shape with the diameter of the interior doughnut hole sufficient to accommodate gold-plated post 34, can be placed over gold-plated post 34 to rest on the collar of gold-plated pad 38. While plasma ions 20 impinge on unshielded component 22 and provide impurity removal and deoxidizing, energy of plasma ions 20 also is absorbed by fluxless solder preform 40. When the kinetic energy of the plasma ions 20 or RF energy has raised the fluxless solder preform 40 to the liquidus temperature, fluxless solder preform 40 melts, and solder flows vigorously over both the gold-plated posts 34, the gold-plated pad 38, and the teflon-glass PWB 36. After solder reflowing, the solder bond 42, a high integrity solder connection, is formed.

Soldering quality is strongly influenced by wetting angle which depends on the cleanliness of the surfaces being soldered. By cleaning surfaces 23 and 25 in FIG. 1 at the same time soldering is performed, the need for flux is eliminated. In addition, this method allows a soldering operation to be performed when using materials which cannot withstand being heated to soldering temperature. In the particular embodiment of unshielded component 22 in FIG. 2, the PEI baseplate 32 will deform if subjected to a temperature above 212 degrees Celsius. For liquidus temperature of a typical tin-lead solder at 179 degrees Celsius, a temperature of 200 to 220 degrees Celsius would be required in standard methods to successfully solder (due to the thermal mass of objects being soldered). Thus, standard soldering could easily harm the PEI baseplate 32.

Since only those surfaces exposed to the forming gas atmosphere and RF excitation are subject to the plasma ion 20 bombardment, heating by the plasma ions 20 can only occur directly on surfaces 23 and 25. Because of the directional nature of the plasma ions 20, sensitive areas can be protected by covering them with another material, such as the shield 26. The only way for shielded component 24 to be heated is by conduction through substrate 28 or through the shield 26. Before heat by conduction has significantly heated shielded component 24, however, unshielded parts 22 will have been soldered and the substrate 28 with shielded component 24 and unshielded components 22 removed from the plasma chamber 10. The difference in temperature between that which shielded component 24 and unshielded components 22 are subjected is dependent on the size, composition, and mass of the shield 26.

A plasma based soldering apparatus and method has been described which overcomes specific problems and accomplishes certain advantages relative to prior art methods and mechanisms. The improvements over known technology are significant. First, no flux is required for soldering, and thus no cleaning of flux residues after soldering is required. High quality, reliable solder connections result. Second, cleaning is performed at the same time as soldering, minimizing steps and complexity. Third, components which cannot withstand heating to soldering temperature or cleaning of residual flux can be soldered with this method. The technique is thus suitable for use where temperature sensitivity would otherwise be a problem. Fourth, no independent heat source (such as infrared) is required. Since the plasma is the source of heating, thermal overshoot is not likely as heating stops once the plasma is turned off. Fifth, no special cooling mechanisms or high vacuum systems are required, again promoting simplicity and reliability. Sixth, multiple solder joints can be soldered simultaneously, resulting in increased efficiency in a relatively inexpensive system suitable even for table top use.

Thus, there has also been provided, in accordance with an embodiment of the invention, a plasma based soldering method that fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

What is claimed is:

1. A method of soldering without the use of flux, comprising the steps of:
   depositing solder at the junction of a first surface and a second surface, the first and second surfaces immediately adjacent to one another;
   placing the first surface, the second surface and the solder in a chamber;
   evacuating the chamber to a low pressure;
   providing a plasma within the chamber;
   exciting the plasma;
   cleaning the first surface, the second surface and the solder with the plasma;
   simultaneously heating the solder exclusively with the plasma; and
   reflowing the solder on the first surface and on the second surface to form a solder bond between the first and second surfaces.

2. A method of soldering as claimed in claim 1 wherein the step of evacuating the chamber comprises the step of vacuum pumping the chamber to an absolute pressure of approximately 125 pascal (approximately one torr).

3. A method of soldering as claimed in claim 1 wherein the step of providing a plasma comprises the step of providing a forming gas mixture of hydrogen and nitrogen gas in the plasma chamber.

4. A method of soldering as claimed in claim 1 wherein the step of providing a plasma within the chamber comprises the steps of:
   providing a hydrogen gas and nitrogen gas mixture in the plasma chamber; and
   providing a hydrogen gas concentration in a range of 5% to 15% of the hydrogen gas and nitrogen gas mixture.

5. A method of soldering as claimed in claim 1 wherein the step of exciting the plasma comprises the step of energizing the plasma between a first electrode and a second electrode by applying a radio frequency (RF) energy source connected across the first electrode and the second electrode, producing excited plasma ions.

6. A method of soldering as claimed in claim 5 wherein the step of energizing the plasma occurs for a time period in a range of approximately 7 to 8 minutes.

7. A method of soldering as claimed in claim 5 wherein the step of cleaning the first surface, the second surface, and the solder comprise the steps of:
   bombarding the first surface, the second surface, and the solder with the plasma ions, the first surface, the second surface, and the solder each having a surface oxide layer;
   absorbing the plasma ions into the surface oxide layer of the first surface, the second surface, and the solder;
   reacting the plasma ions with the surface oxide layer of the first surface, the second surface, and the solder, creating reaction products; and
   desorbing the reaction products from the first surface, the second surface, and the solder to improve wetting of the solder on the first and the second surfaces upon solder reflow.

8. A method of soldering as claimed in claim 5 wherein the step of heating the solder comprises the step of bombarding the solder with the plasma ions, using no additional heat source.

9. A method of soldering as claimed in claim 1 wherein the steps of cleaning the first surface, the second surface and the solder occurs simultaneously with the step of heating the solder.

10. A method of soldering as claimed in claim 1 wherein the steps of cleaning the first surface, the second surface and the solder, heating the solder, and reflowing the solder occur simultaneously.

11. A method of soldering as claimed in claim 10 wherein the steps of cleaning the first surface, the second surface and the solder, heating the solder, and reflowing the solder occur simultaneously for approximately 7 to 8 minutes.

12. A method of soldering as claimed in claim 1 wherein the step of depositing a solder comprises the step of depositing tin-lead solder.

13. A method of soldering as claimed in claim 12 wherein the step of reflowing the solder occurs at a solder temperature in the range of approximately 178 degrees Celsius to 210 degrees Celsius.

14. A method of soldering without the use of flux, comprising the steps of:
   depositing solder at the junction of a first surface and a second surface, the first and second surfaces immediately adjacent to one another;
   covering a component and a third surface immediately adjacent to the component with a shield;

placing the first surface, the second surface, the solder, the component, the third surface and the shield in a chamber;

evacuating the chamber to a low pressure;

providing a plasma within the chamber;

exciting the plasma;

cleaning the first surface, the second surface and the solder with the excited plasma;

shielding the component and the third surface from the excited plasma;

heating the solder exclusively with the excited plasma; and reflowing the solder on the first surface and on the second surface to form a solder bond between the first and second surfaces.

15. A method of soldering as claimed in claim 14 wherein the step of evacuating the chamber comprises the step of vacuum pumping the chamber to an absolute pressure of approximately 125 pascal (approximately one torr).

16. A method of soldering as claimed in claim 14 wherein the step of providing a plasma comprises the step of providing a forming gas mixture of hydrogen and nitrogen gas in the plasma chamber.

17. A method of soldering as claimed in claim 14 wherein the step of providing a plasma within the chamber comprises the steps of:

providing a hydrogen gas and nitrogen gas mixture in the plasma chamber; and providing a hydrogen gas concentration in a range of 5% to 15% of the hydrogen gas and nitrogen gas mixture.

18. A method of soldering as claimed in claim 14 wherein the step of exciting the plasma comprises the step of energizing the plasma between a first electrode and a second electrode using a radio frequency (RF) energy source connected across the first electrode and the second electrode, producing excited plasma ions.

19. A method of soldering as claimed in claim 18 wherein the step of energizing the plasma occurs for a time period in a range of approximately 7 to 8 minutes.

20. A method of soldering as claimed in claim 18 wherein the step of cleaning the first surface, the second surface, and the solder comprise the steps of:

bombarding the first surface, the second surface, and the solder with the plasma ions, the first surface, the second surface, and the solder each having a surface oxide layer;

absorbing the plasma ions into the surface oxide layer of the first surface, the second surface, and the solder;

reacting of the plasma ions with the surface oxide layer of the first surface, the second surface, and the solder, creating reaction products; and desorbing the reaction products from the first surface, the second surface, and the solder to improve wetting of the solder on the first and the second surfaces upon solder reflow.

21. A method of soldering as claimed in claim 14 wherein the step of shielding the component and the third surface comprises absorbing the plasma ions into the shield, preventing heating of the component and the third surface.

22. A method of soldering as claimed in claim 18 wherein the step of heating the solder comprises the step of bombarding the solder with the plasma ions, using no additional heat source.

23. A method of soldering as claimed in claim 14 wherein the steps of cleaning the first surface, the second surface and the solder occurs simultaneously with the step of heating the solder.

24. A method of soldering as claimed in claim 14 wherein the steps of cleaning the first surface, the second surface and the solder, heating the solder, and reflowing the solder occur simultaneously.

25. A method of soldering as claimed in claim 24 wherein the steps of cleaning the first surface, the second surface and the solder, heating the solder, and reflowing the solder occur simultaneously for a time period in a range of approximately 7 to 8 minutes.

26. A method of soldering as claimed in claim 14 wherein the step of depositing a solder comprises the step of depositing tin-lead solder.

27. A method of soldering as claimed in claim 26 wherein the step of reflowing the solder occurs at a solder temperature in a range of approximately 178 degrees Celsius to 210 degrees Celsius.

28. A method of soldering without the use of flux, comprising the steps of:

providing a plate comprising a first plate surface and a second plate surface, the first plate surface comprising first and second posts covered with metal protruding from the first plate surface opposite the second plate surface;

providing a wiring board with first and second holes with first and second hole linings, respectively, of metal, the first and second holes fitting over the first and second posts, respectively, the board to be soldered to the plate at the first hole-first post junction, but not at the second hole-second post junction;

placing the wiring board on the first plate surface so that the first and second posts go through the first and second holes, respectively;

depositing solder at the first hole lining-first post junction;

covering the second hole lining-second post junction with a shield;

placing the the plate, the wiring board, the solder, and the shield in a chamber;

evacuating the chamber to a low pressure;

providing a plasma within the chamber;

exciting the plasma;

cleaning the first post covered with metal, the first hole lining, and the solder with the excited plasma;

shielding the second post and second hole lining from the excited plasma;

heating the solder exclusively with the excited plasma; and reflowing the solder on the first post covered with metal and on the first hole lining to form a solder bond.

29. A method of soldering as claimed in claim 28 wherein the step of evacuating the chamber comprises the step of vacuum pumping the chamber to an absolute pressure of approximately 125 pascal (approximately one torr).

30. A method of soldering as claimed in claim 28 wherein the step of providing a plasma within the chamber comprises the steps of:

providing a hydrogen gas and nitrogen gas mixture in the plasma chamber; and providing a hydrogen gas concentration in a range of 5% to 15% of the hydrogen gas and nitrogen gas mixture.

31. A method of soldering as claimed in claim 28 wherein the step of exciting the plasma comprises the step of energizing the plasma between a first electrode and a second electrode using a radio frequency (RF) energy source connected across the first electrode and the second electrode, producing excited plasma ions.

32. A method of soldering as claimed in claim 31 wherein the step of energizing the plasma occurs for a time period in the range of approximately 7 to 8 minutes.

33. A method of soldering as claimed in claim 31 wherein the step of cleaning the first post covered with metal, the first hole lining, and the solder comprise the steps of:
bombarding the first post covered with metal, the first hole lining, and the solder with the plasma ions, the first post covered with metal, the first hole lining, and the solder each having a surface oxide layer;
absorbing the plasma ions into the surface oxide layer of the first post covered with metal, the first hole lining, and the solder;
reacting of the plasma ions with the surface oxide layer of the first post covered with metal, the first hole lining, and the solder, creating reaction products; and
desorbing the reaction products from the first post covered with metal, the first hole lining, and the solder to improve wetting of the solder on the first post covered with metal and the first hole lining.

34. A method of soldering as claimed in claim 31 wherein the step of shielding the second post and second hole lining comprises absorbing the plasma ions with the shield, preventing heating of the second post and second hole lining.

35. A method of soldering as claimed in claim 31 wherein the step of heating the solder comprises the step of bombarding the solder with the plasma ions, using no additional heat source.

36. A method of soldering as claimed in claim 28 wherein the steps of cleaning the first post covered with metal, the first hole lining and the solder occurs simultaneously with the step of heating the solder.

37. A method of soldering as claimed in claim 28 wherein the steps of cleaning the first post covered with metal, the first hole lining and the solder, heating the solder, and reflowing the solder occur simultaneously.

38. A method of soldering as claimed in claim 37 wherein the steps of cleaning the first post covered with metal, the first hole lining and the solder, heating the solder, and reflowing the solder occur simultaneously for a time period of approximately 7 to 8 minutes.

39. A method of soldering as claimed in claim 28 wherein the step of depositing a solder comprises the step of depositing tin-lead solder.

40. A method of soldering as claimed in claim 39 wherein the step of reflowing the solder occurs at a solder temperature in the range of approximately 178 degrees Celsius to 210 degrees Celsius.

* * * * *